US006847587B2

(12) United States Patent
Patterson et al.

(10) Patent No.: US 6,847,587 B2
(45) Date of Patent: Jan. 25, 2005

(54) SYSTEM AND METHOD FOR IDENTIFYING AND LOCATING AN ACOUSTIC EVENT

(76) Inventors: Frank K. Patterson, Rte. 1, Box 121, Woodward, OK (US) 73801; Kevin C. Baxter, 5521 Cleon Ave., North Hollywood, CA (US) 91601; Fred H. Holmes, Rte. 3, Box 79, Cleveland, OK (US) 74020

( * ) Notice: Subject to any disclaimer, the term of this patent is extended or adjusted under 35 U.S.C. 154(b) by 0 days.

(21) Appl. No.: 10/248,511

(22) Filed: Jan. 24, 2003

(65) Prior Publication Data

US 2004/0100868 A1 May 27, 2004

Related U.S. Application Data

(63) Continuation-in-part of application No. 10/214,247, filed on Aug. 7, 2002.

(51) Int. Cl.[7] .............................. G01S 3/80; G01S 5/30
(52) U.S. Cl. ....................................... 367/127; 367/906
(58) Field of Search ................................ 367/906, 127, 367/124

(56) References Cited

U.S. PATENT DOCUMENTS

| 4,792,806 A | 12/1988 | Bent et al. |
| 4,855,671 A | 8/1989 | Fernandez |
| 5,504,717 A | 4/1996 | Sharkey et al. |
| 5,703,835 A | 12/1997 | Sharkey et al. |
| 5,973,998 A | 10/1999 | Showen et al. |
| H1916 H | 11/2000 | Hollander |
| 6,178,141 B1 | 1/2001 | Duckworth et al. |
| 6,600,417 B2 * | 7/2003 | Lerg et al. ................... 340/540 |

FOREIGN PATENT DOCUMENTS

| WO | WO 98/20468 | 5/1998 |
| WO | WO 00/73811 A1 | 12/2000 |

OTHER PUBLICATIONS

Glynn Lewis, Scott Shaw, Michael Crowe, Clay Cranford, Kevin Torvik, Dr. Peter Scharf, and Bob Stellingworth "Urban Gunshot and Sniper Location—Technologies and Demonstration Results," Proc. SPIE vol. 4708, pp. 315–323.
Lorraine Green Mazerolle, "Using Gunshot Detection Technology in High–Crime Areas," National Institute of Justice, U.S. Department of Justice (Washington, D.C.), (Jun. 1998).

* cited by examiner

Primary Examiner—Daniel Pihulic
(74) Attorney, Agent, or Firm—Fellers, Snider, Blankenship, Baiely & Tippens, P.C.

(57) ABSTRACT

A system and method for detecting, identifying, and fixing the location of the source of an acoustic event. The inventive system includes: a plurality of sensors dispersed at somewhat regular intervals throughout a monitored area; a communication network adapted to deliver information from the sensors to a host processor; and a process within the host processor for determining, from the absolute times of arrival of an event at two or more sensors, a position of the source of the event. Acoustic events are detected and analyzed at each sensor so that the sensor transmits over the network: an identifier for the sensor; an identifier for the type of event; and a precise absolute time of arrival of the event at the sensor. In a preferred embodiment, the system also identifies the type of weapon firing a gunshot.

14 Claims, 17 Drawing Sheets

SYSTEM AND METHOD FOR IDENTIFYING AND LOCATING AN ACOUSTIC EVENT

CROSS REFERENCE TO RELATED APPLICATIONS

This application is a continuation-in-part of copending U.S. patent application Ser. No. 10/214,247, filed Aug. 7, 2002.

BACKGROUND OF INVENTION

1. Field of the Invention

The present invention relates to a system and method for identifying and locating an acoustic event. More particularly, but not by way of limitation, the present invention relates to a system for identifying an explosive event, such as a gunshot, at a remote location, reporting the event including a precise time of arrival to a host system, and calculating a location of the source of the event in the host system.

2. Background of the Invention

Generally speaking, there is a long felt need for a system and method to pinpoint the exact location of the source of gunfire, particularly in an urban setting. In many large cities, gun-related violence has become a plague of epidemic proportions. It is estimated that roughly 10,000 Americans die each year from gun related injuries with an estimated 200,000 non-fatal injuries. Recent events such as the so-called Suburban Sniper in the Washington D.C. area have further underscored the need to resolve this problem. Unfortunately, prior art solutions have been either inadequate or too costly to gain wide acceptance in the field.

In a typical gunshot locating system, a plurality of sensors are situated in the field, usually at fairly regular intervals along an x-y grid. Each sensor includes a microphone and, presumably, an amplifier to produce an audio signal. The audio signal is then carried by a dedicated telephone line to a central location where the sound is processed. Upon detecting a gunshot from the processed audio, relative times of arrivals at the central location are processed to determine a location of the source of the gunshot.

One such system, U.S. Pat. No. 5,973,998 issued to Showen, et al. discloses a system wherein sensors are placed at a density of roughly six to ten sensors per square mile. Showen takes advantage of a naturally occurring phenomenon known as spatial filtering to improve the accuracy and reliability over that of prior systems. While the Showen system radically reduces the sensor density compared to prior art systems, as high as 80 sensors per square mile, each sensor, nonetheless, still requires a dedicated phone line. As one can see, to effectively monitor a large metropolitan area, an outrageous number of telephone lines would be required, resulting in a substantial investment in infrastructure, not to mention large on-going costs. Such systems can often take months to install.

In addition to the large number of dedicated phone lines required by prior art systems, such systems transport audio information over comparatively long distances. The signals, as such, are subject to a number of degrading factors such as noise, crosstalk, inadvertent disconnection, and the like. Such factors may cause gunshots to go undetected. Latency in one or more communication channels will cause the system to produce and erroneous location.

Another known method for identifying the location of a gunshot relies on a special sensor having several microphones arranged in a geometric array. A radial direction can be determined by measuring the differences in arrival times at the various microphones. Unfortunately, such systems suffer from limited accuracy in the determination of the radial angle, which in turn, translates into significant errors in the positional accuracy of the source of the noise when triangulation of two or more sensors is performed. Since errors in the radial angle result in ever increasing position error as the distance from the sensor to the source increases, the reported position will be especially suspect toward the outer limits of the sensor's range.

Another type of gunshot sensor detects a gunshot and attempts to identify a particular type of weapon, or at least a class of weapon. These systems generally analyze the duration, envelope, or spectral content of a gunshot and compare the results to known samples. Combining a trustworthy identification of a weapon with the precise location of a shot fired by the weapon would be particularly useful in the early stages of a police investigation and could allow early correlation of a crime to a repeat perpetrator.

It is thus an object of the present invention to provide a system for detecting an acoustic event, such as a gunshot, identifying the acoustic event, and fixing a location of the source of the event.

It is a further object of the present invention to provide a gunshot detection system which can be deployed over a large area without incurring undue costs in infrastructure and undue recurring costs.

It is still a further object of the present invention to provide a system for fixing the location of an acoustic event with greater accuracy than has been possible with existing systems.

It is still a further object of the present invention to provide a system for fixing the location of an acoustic event that can be rapidly deployed.

SUMMARY OF INVENTION

The present invention provides a system and method for detecting, identifying, and fixing the location of the source of an acoustic event. In a preferred embodiment, the inventive system includes: a plurality of sensors dispersed at somewhat regular intervals throughout a monitored area; a communication network adapted to deliver information from the sensors to a host processor at a central location; and a process within the host processor for determining, from the absolute times of arrival of an event at two or more sensors, a position of the source of the event.

In a preferred embodiment, each sensor includes: a microphone for receiving an acoustic event; a processor for discriminating acoustic events from other sounds; a synchronized clock; and an interface to the communication network. The sensor's processor continuously monitors environmental sound in the proximity of the sensor and detects events known to produce sound of a particular class. Upon detecting an event, the type of event and the precise time of arrival of the event are transmitted to the host processor via the communication network. Since each sensor includes a real-time clock synchronized to the real-time clocks of the other sensors in the network, latency in the delivery of information to the host computer will not affect the accuracy of the position calculation. Accordingly, large numbers of sensors can share a common communication channel, unlike prior art systems which require a dedicated channel for each sensor.

In one preferred embodiment, the sensor further includes stored signatures of various types of firearms. Each detected event is compared to the table of known firearm types. The best-fit between the detected event and one of the stored types is then transmitted to the host system along with a quality value indicative of the degree to which the detected event correlates with the known sample.

In another preferred embodiment, the synchronized clock is a GPS receiver. The GPS receiver also provides the location of the sensor, which is periodically reported to the host processor. Global positioning satellite systems ("GPS") are well known in the art. Such systems typically consist of a constellation of satellites in earth orbit. Each satellite includes a highly accurate clock and periodically transmits, among other things, time codes back towards earth. By processing the differences in time delay of the signals received from several satellites, it is possible to calculate the position of a receiver in three dimensions. With regard to the present invention, however, an additional value of the GPS system lies in the fact that clocks at multiple sites, virtually anywhere in the world, may be precisely synchronized, through received GPS time codes. It is generally held that two or more clocks may be synchronized within 350 nanoseconds of each other, independent of their respective locations. As will be appreciated by those skilled in the art, the distance traveled by an acoustic wave in free air over 350 nanoseconds is negligible.

In still another preferred embodiment, the inventive sensors are intended to hang from existing power lines. Such power lines are typically elevated which will improve the "view" of the sensor towards acoustic events and virtually eliminate the risk of tampering. Another advantage lies in the fact that a sensor may also draw power from the power line through induction, even though no physical electrical connection is present. Preferably, a toroidal-type coil is placed around the power line such that AC current flowing in the power line will induce a voltage in the coil sufficient to operate the circuitry of the sensor. In addition, power line communication is possible over somewhat limited distances by driving the coil with a modulated carrier encoded with digital information. The carrier rides on the electrical power transmitted over the power line.

In yet another preferred embodiment, the sensors lying within a given area are each configured to transmit information concerning received events over a radio frequency link. Each unit is programmed to transmit information in a manner which will ensure collisions do not occur, or, if a collision does occur, retransmissions will not collide.

In yet another preferred embodiment, a battery-powered sensor is configured to be worn by a soldier or law enforcement officer. When the sensor detects an event, the time of arrival information and characteristics of the event are transmitted to a host processor for analysis. In a battlefield environment, the information can be used to direct return fire, program guided weapons, or to direct a laser for laser guided weapons. In any event, the person wearing the sensor can be provided a handheld computer, such as a PDA, which displays sources of gunfire relative to the user.

Further objects, features, and advantages of the present invention will be apparent to those skilled in the art upon examining the accompanying drawings and upon reading the following description of the preferred embodiments.

DETAILED DESCRIPTION

Before explaining the present invention in detail, it is important to understand that the invention is not limited in its application to the details of the construction illustrated and the steps described herein. The invention is capable of other embodiments and of being practiced or carried out in a variety of ways. It is to be understood that the phraseology and terminology employed herein is for the purpose of description and not of limitation.

Figure 1:
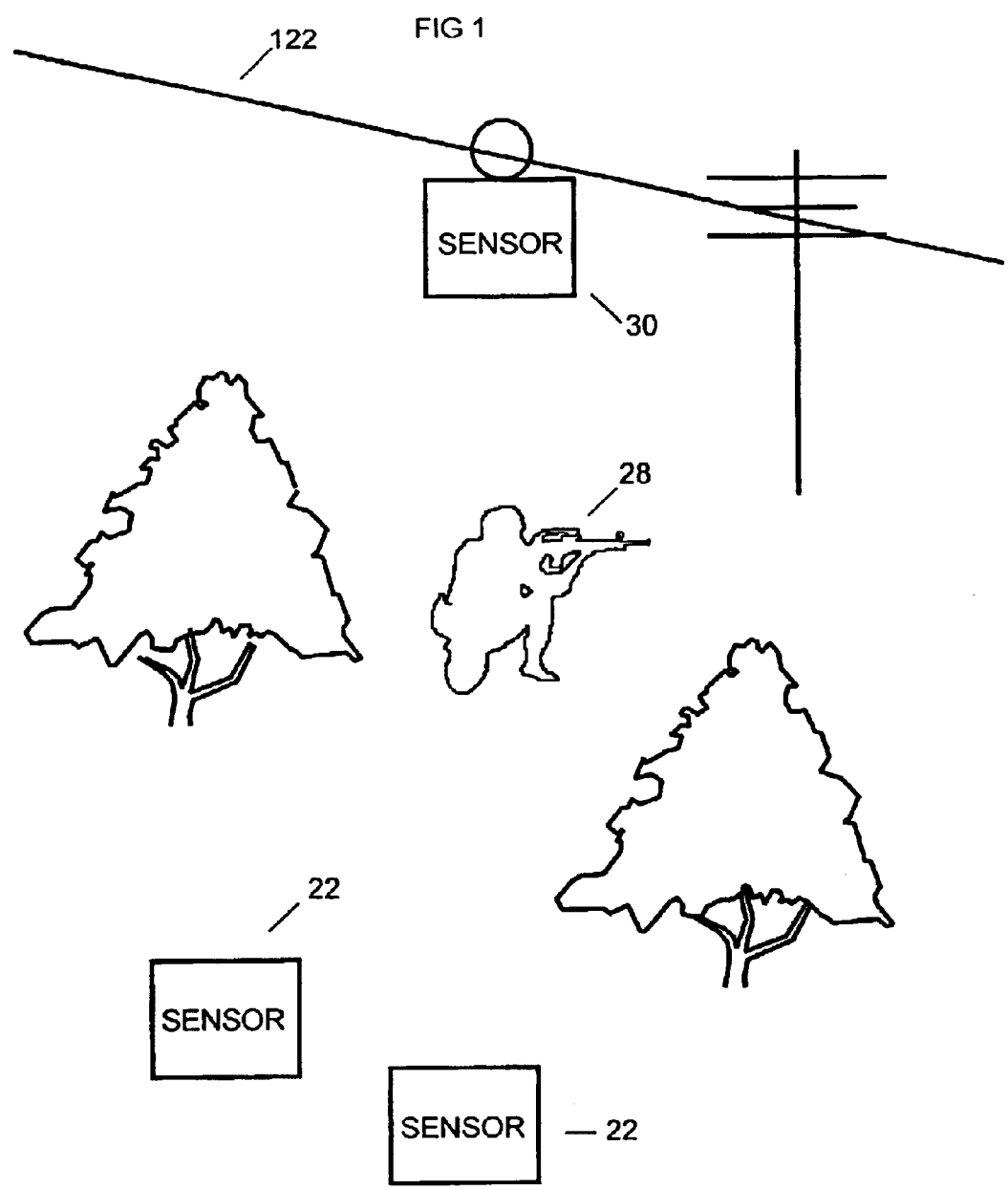
FIG. 1 depicts the general environment in which the inventive system and method are used.

Referring now to the drawings, wherein like reference numerals indicate the same parts throughout the several views, a network of inventive sensors 22 and 30 are shown in their general environment in FIG. 1. In a preferred embodiment, a plurality of sensors 22 and 30 are dispersed over an area, typically at fairly regular intervals. Preferably, each sensor 22 is placed such that it has a relatively unobstructed acoustic view around its immediate area. By way of example and not limitation, suitable sites include: suspended from an electrical power line 122, as shown with regard to sensor 30; placed atop a building; placed atop streetlight poles; from existing towers, in trees, and the like. In the event gun 28 is discharged, sensors 22 and 30 receive and process the acoustic information associated with the gunshot, as discussed hereinbelow, to provide personnel with as much information as possible about the source of the gunfire.

Figure 2:
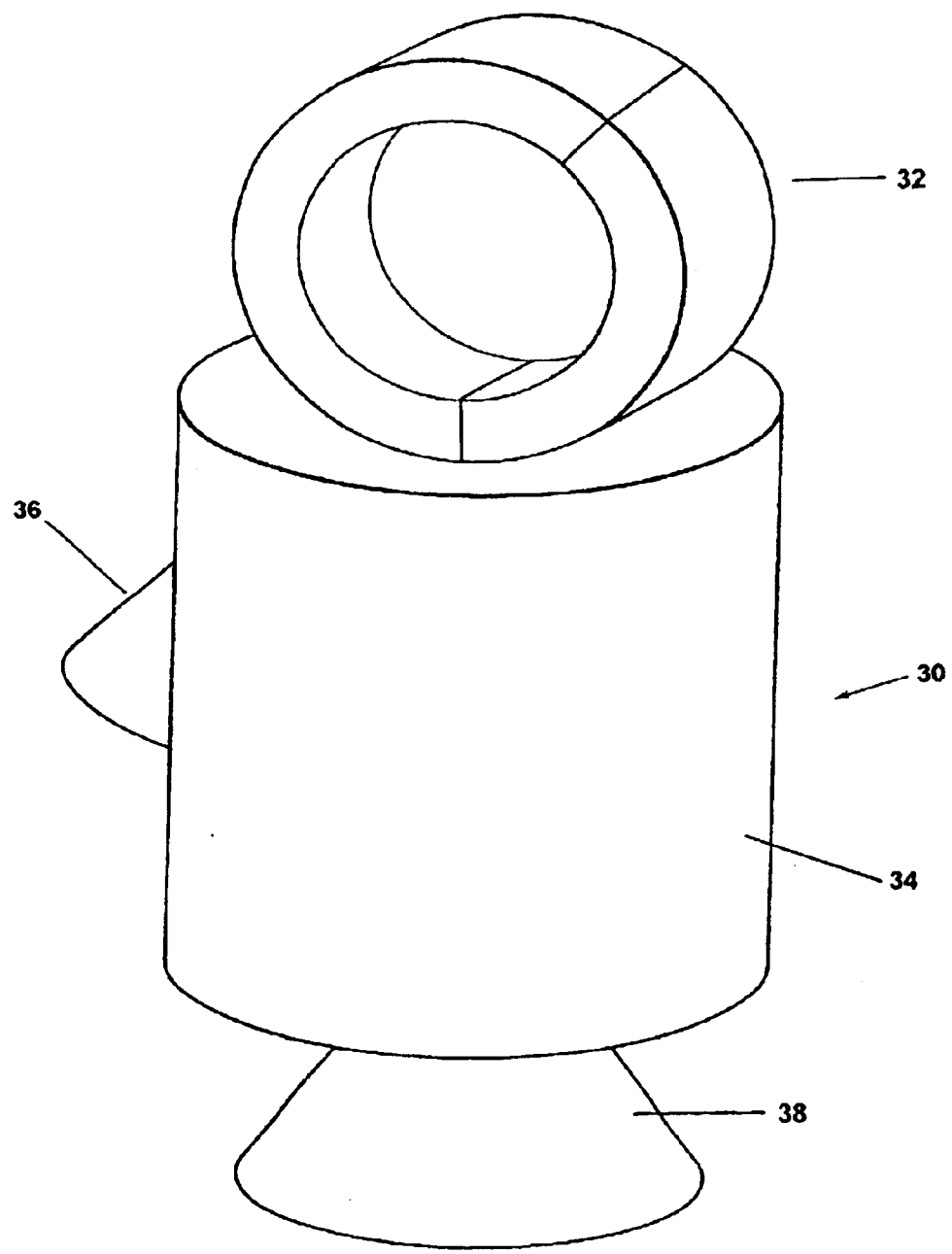
FIG. 2 provides a perspective view of a sensor for use in the inventive system adapted to inductively couple electrical power from a power line.
Figure 3:
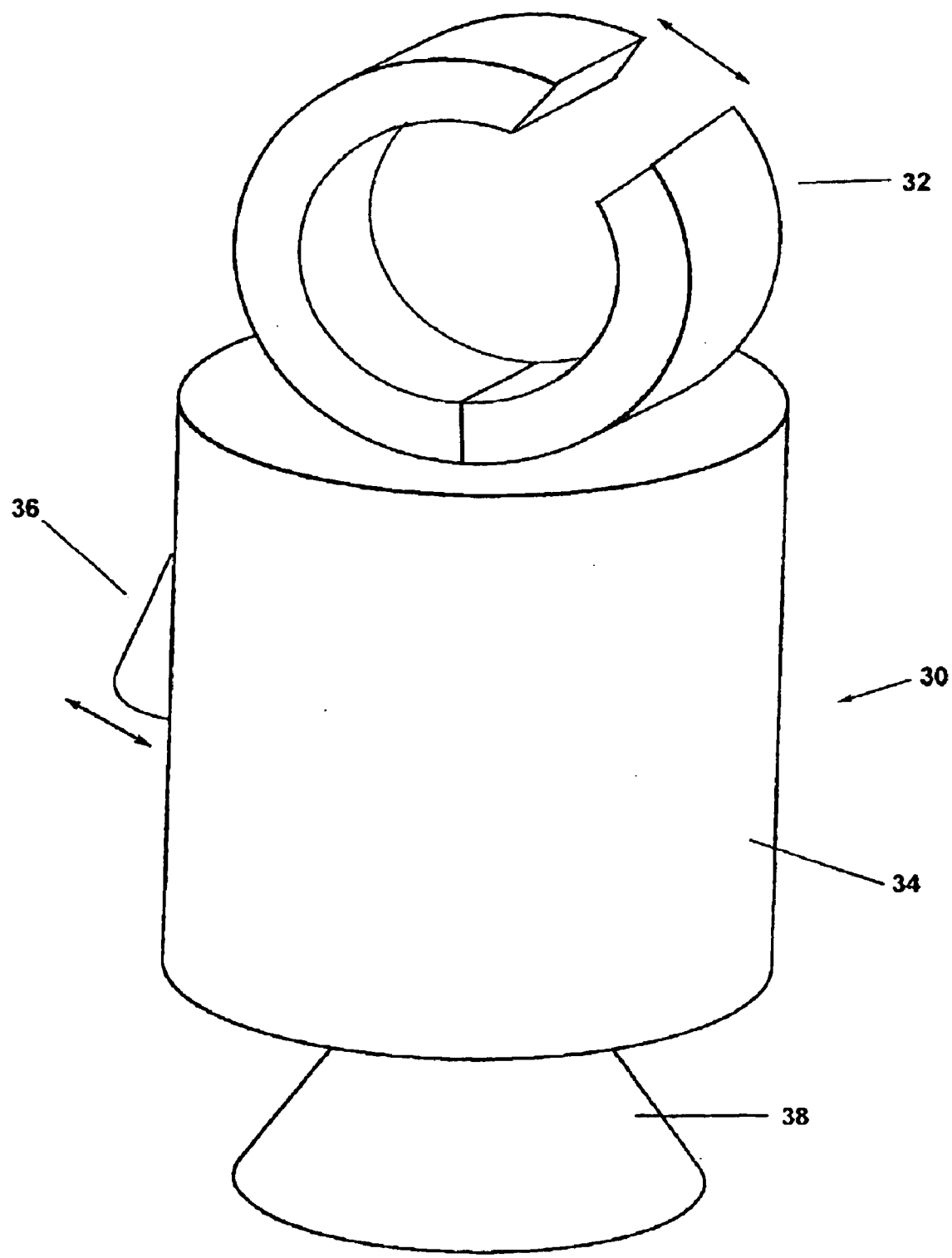
FIG. 3 provides a perspective view of the sensor of FIG. 2 with the clip opened for attachment to a power line.

As previously mentioned, sensor 22 can take on a number of embodiments which are adapted for placement in a particular environment. Turning to FIGS. 2 and 3, in one preferred sensor embodiment, sensor 30 is configured to hang from power lines. Sensor 30 comprises: a housing 34 which protects its electronic circuitry from the elements; an acoustic reflector 38 for directing sound waves towards a relatively protected environment under housing 34; and a toroidal clip 32 which serves the dual purposes of supporting sensor 30 from a power line and inductively coupling electrical power from the power line into sensor 30 to provide the electrical power requirements of sensor 30.

Preferably, clip 32 is normally biased towards its closed position (as shown in FIG. 3) by a spring, or the like, (not shown). However clip 32 includes lever 36 which can be used to temporarily open clip 32 for placement over a power line 122 (FIG. 1).

Figure 4:
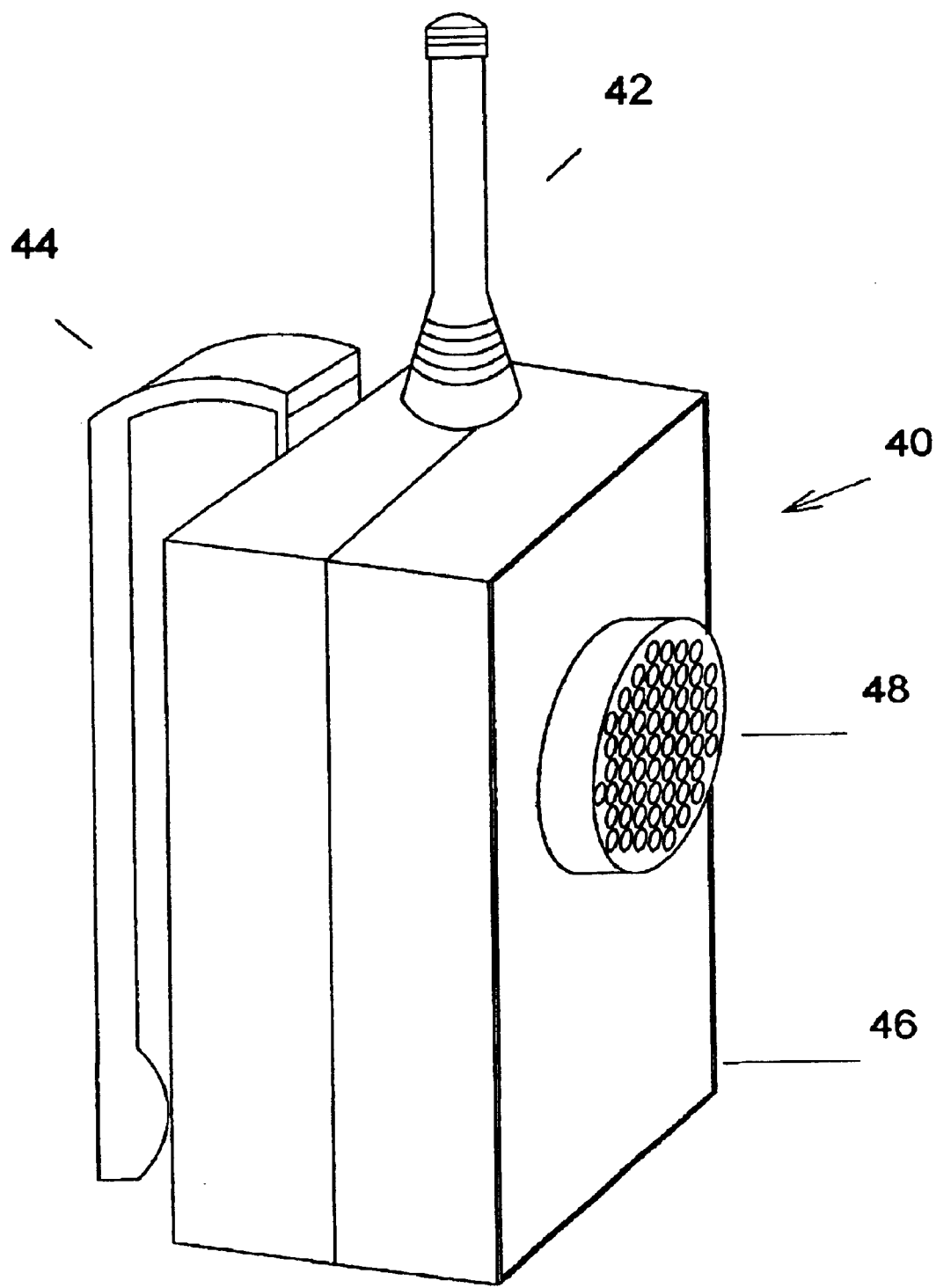
FIG. 4 provides a perspective front elevation view of a sensor for use in the inventive system which may be worn by a soldier or police officer.

Turning to FIG. 4, in another preferred embodiment, sensor 40 can alternatively be configured for mobile use, such as being clipped to a soldier or police officer. Sensor 40 includes: housing 46 which encloses the electronic circuitry of sensor 40; microphone 48 for receiving acoustic information; antenna 42 for communication on a wireless network; and belt clip 44 for attachment to belt, helmet, or other article of clothing.

Figure 5:
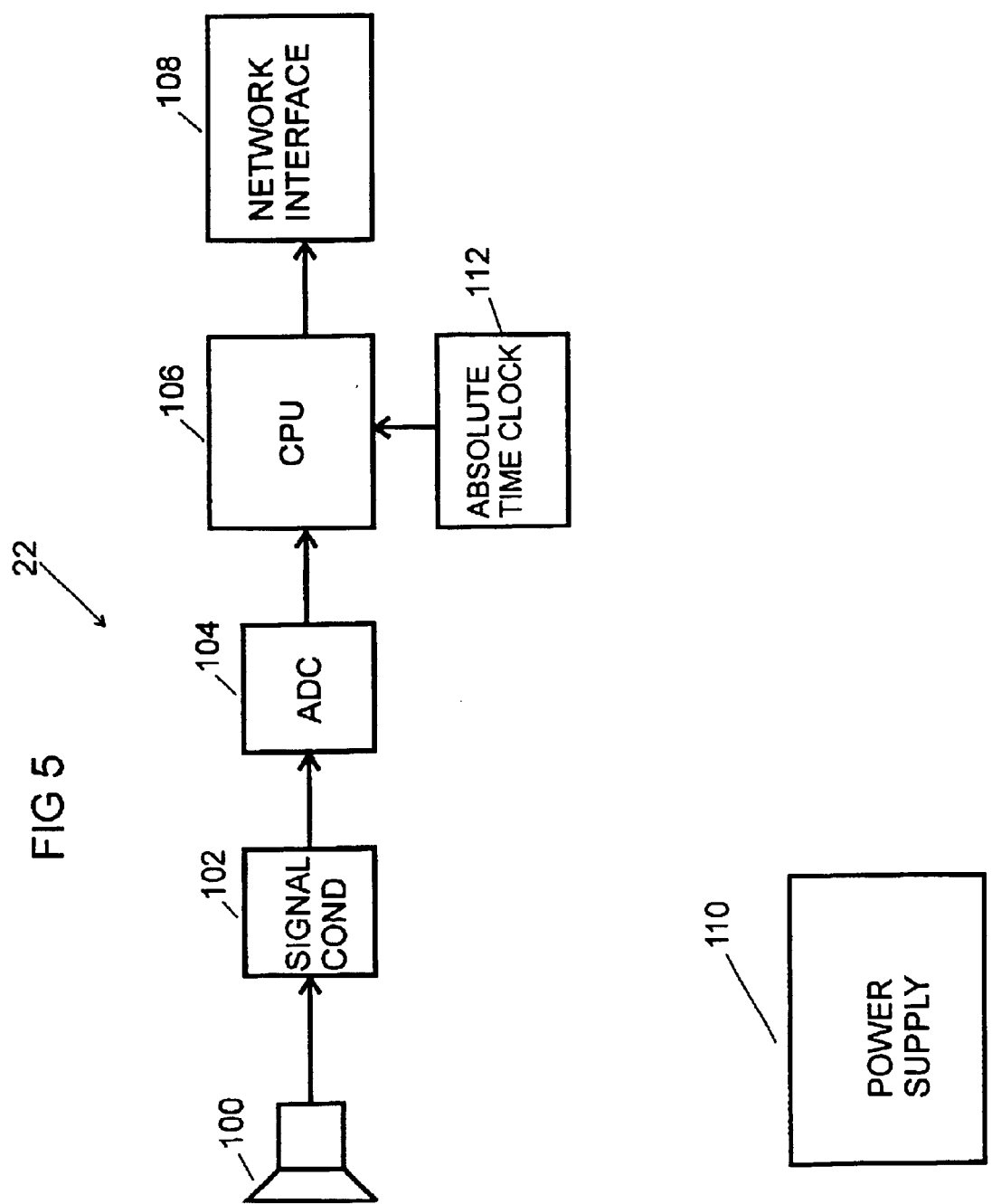
FIG. 5 shows a block diagram of a sensor for use in the inventive system.

Referring to FIG. 5, preferably a sensor, such as sensor 22, includes: a microphone 100 for receiving audible events; signal processing circuitry 102 which amplifies and filters the output of microphone 100; CPU 106 for performing the processing functions of sensor 22; analog to digital converter 104 which converts the conditioned signal from the microphone 100 in to digital form for processing by CPU 106; network interface 108 for communication with host 26 (FIG. 9); absolute time clock 112; and power supply circuitry 110 for supplying the electrical needs of sensor 22.

While virtually any type of microphone can be used in the inventive sensor, electret condenser or dynamic microphones are particularly well suited. Audible information is continuously received by microphone 100; amplified by signal conditioner 102; converted to digital information by ADC 104, and analyzed by CPU 106. Generally speaking, a particular sound will have features which distinguish that sound from other sounds. Explosive sounds, for example, are characterized by a burst of noise having a sharp attack, a relatively short sustain, and an exponential decay. For purposes of the present invention, attack, sustain, and decay are terms used to identify portions of the envelope of a sound, the envelope being representative of the sound volume of the sound at any particular point in time. "Attack" refers to the beginning portion of the envelope, "sustain" refers to a relatively steady state condition, if one exists, following the attack, and "decay" refers to the portion of envelope terminating the sound. CPU 106 processes incoming audio to derive the envelope and optionally, spectral content to compare these features to like features of known sounds.

In addition to amplifying the signal from microphone 100, signal conditioner 102 also provides some measure of filtering of the audio signal. Preferably, conditioner 102 includes an anti-aliasing filter which provides lowpass filtering at approximately one-half the sample rate of A/D converter 104. As will be appreciated by those skilled in the art, aliasing is a well known problem associated with the digitization of analog signals.

Figure 9:
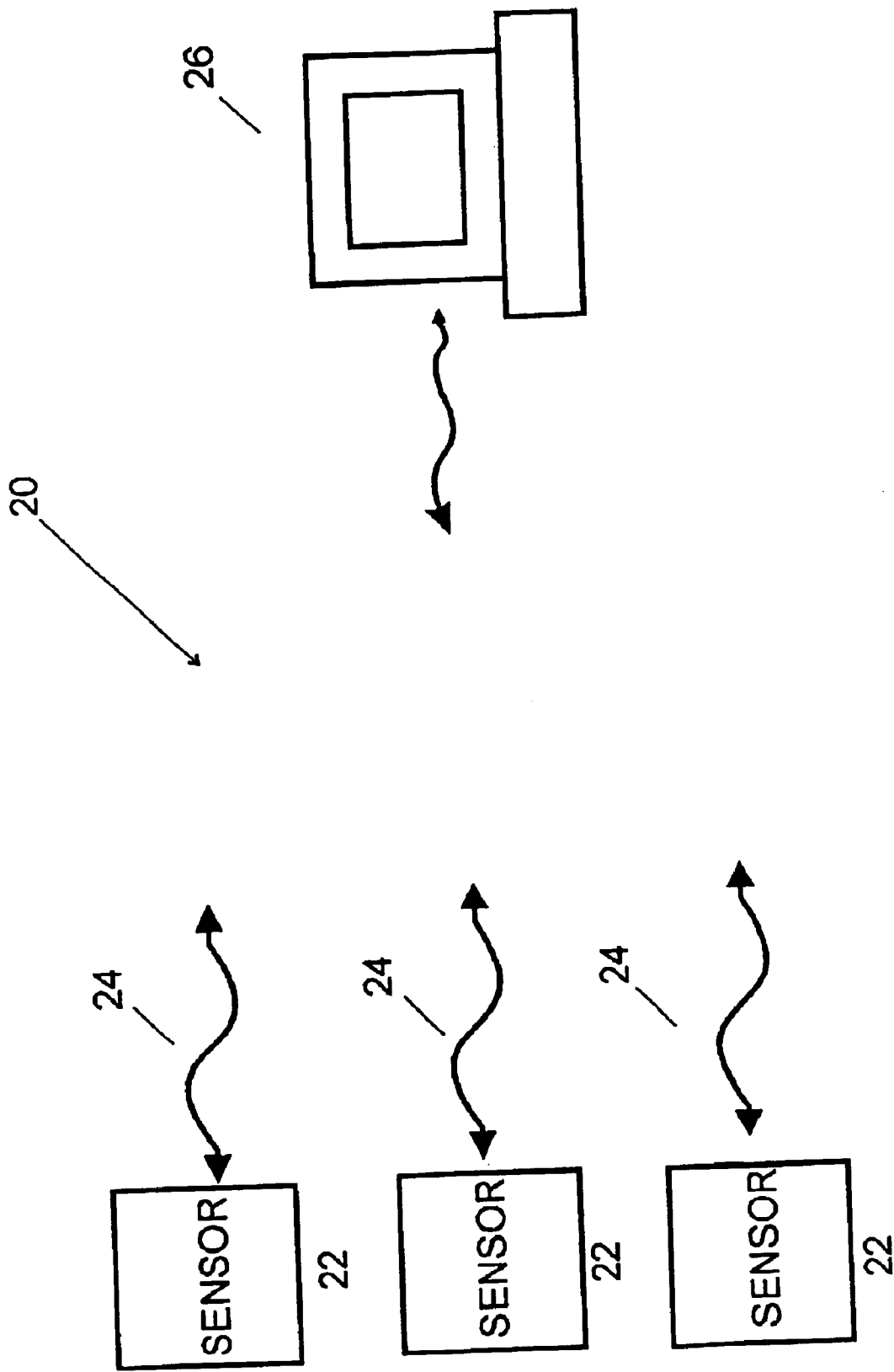
FIG. 9 provides a block diagram of the inventive system with three sensors in place.

With further reference to FIG. 9, when CPU 106 detects a sound indicative of a particular event, the time when the event arrived at the sensor is retrieved from clock 112, logged and transmitted via interface 108. Sensors 22 are connected, either by wires, or in a wireless fashion, through a network 24 which allows communication with a host system 26. If a gun 28 is fired within the audible range of one or more sensors 22, each receiving sensor detects the gunshot and transmits an identifier and a time of arrival of the sound to the host system 26. Clock 112 is synchronized to that of every other sensor in the system so that the relative times of arrival received from multiple sensors at host 26 are meaningful. At the host, the times of arrival from all of the reporting sensors are processed to determine a precise location of the source of the shot.

Figure 6:
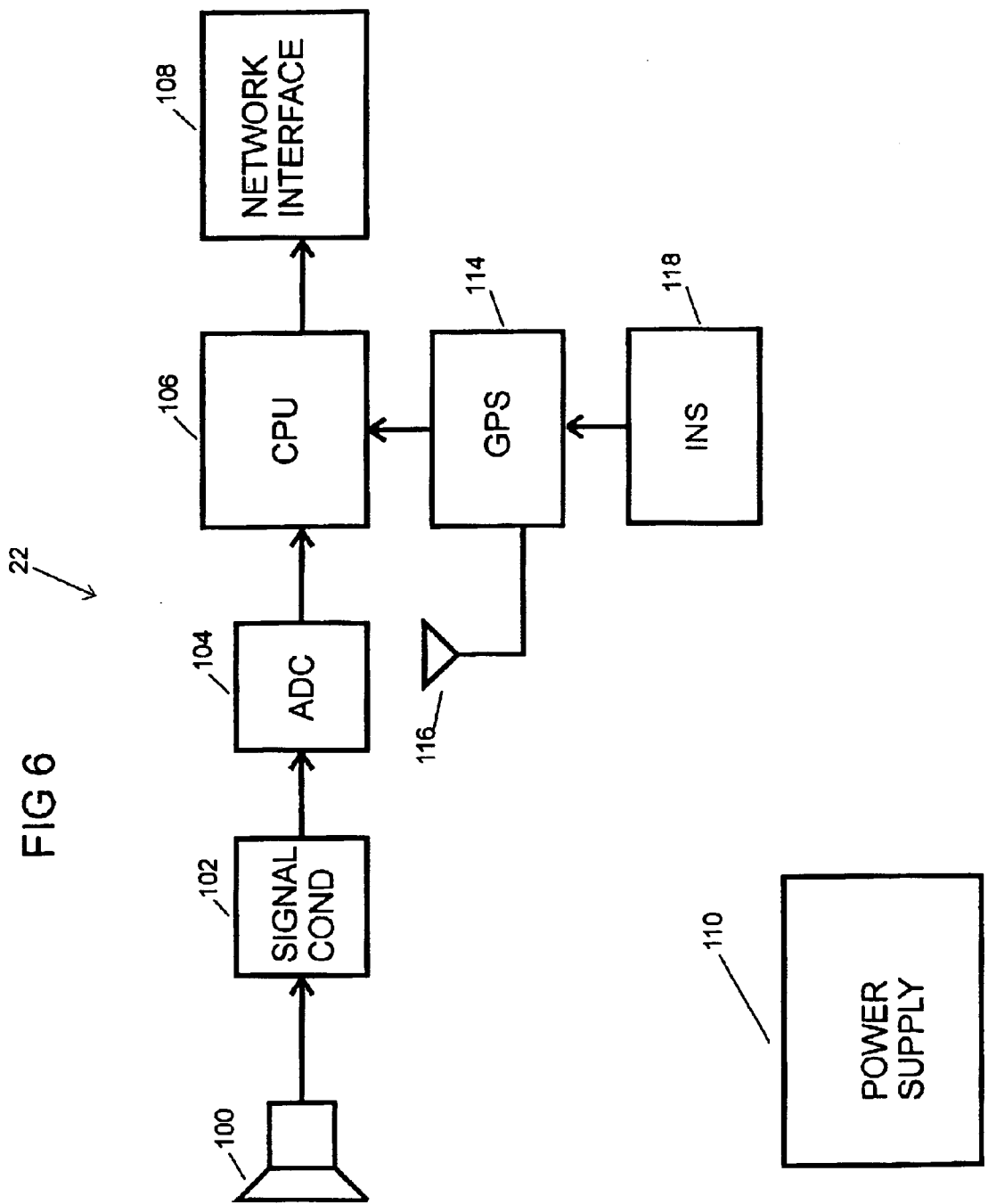
FIG. 6 shows a block diagram of the sensor for use in the inventive system of FIG. 5 wherein the absolute time clock is a GPS receiver.

For purposes of this invention, the term "absolute time" refers to a system for measuring time at each sensor such that the individual clock 112 at any sensor operates in near perfect synchronization with the clock 112 of every other sensor. Turning then to FIG. 6, one preferred method for obtaining absolute time is through the use of a GPS receiver 114. As is well known in the art, each GPS satellite has an internal atomic clock and precise time is periodically transmitted from each satellite to earth.

In addition to time of arrival information, for purposes of triangulation, the host processor 26 must know the precise location of each reporting sensor. Thus, GPS receiver 114 can serve both the purposes of determining the location of the sensor and providing absolute time relative to the other sensors in the network. Alternatively, absolute time could be obtained through a number of other methods such as, by way of example and not limitation, receiving WWV time, or receiving synchronizing information from the host, or a time server, over network 24. It should be noted however, if such a time clock is used, each sensor would have to be placed at a known fixed location such as a survey point or known landmark.

For purposes of this invention, the term "self-surveying" is used to describe embodiments of the inventive system where the location of sensors is determined internally. While a GPS receiver in each sensor is the preferable means for self-surveying, other, equally well suited methods are known. By way of example and not limitation, the system may self-survey by techniques such as radio distancing from a known position, traditional direction finding techniques between the various sensors, etc.

Another concern for sensors placed at remote locations is obtaining electrical power. A mobile sensor 40 is well suited for battery operation since the person wearing the sensor can simply recharge, or replace, the battery at periodic intervals. Unfortunately, remotely placed sensors at fixed locations are probably not as easy to access for such purposes. For such locations a number of options are possible. By way of example and not limitation, power supply 110 could be a battery which is recharged by solar cells when sunlight is available. Such a system would require a battery of sufficient capacity to power the unit through periods of nighttime, snow cover, and the like.

Alternatively, power supply 110 could be a simple AC power supply where sensor locations have conventional household electrical power available. In such installations, power supply 110 could include a battery to survive periods of power outage. A variation on this scheme would be to place sensors atop streetlight poles. Power supply 110 could draw electrical power from the street light circuit at night to charge a battery, and operate from the battery during the day when the streetlight is off.

Figure 7:
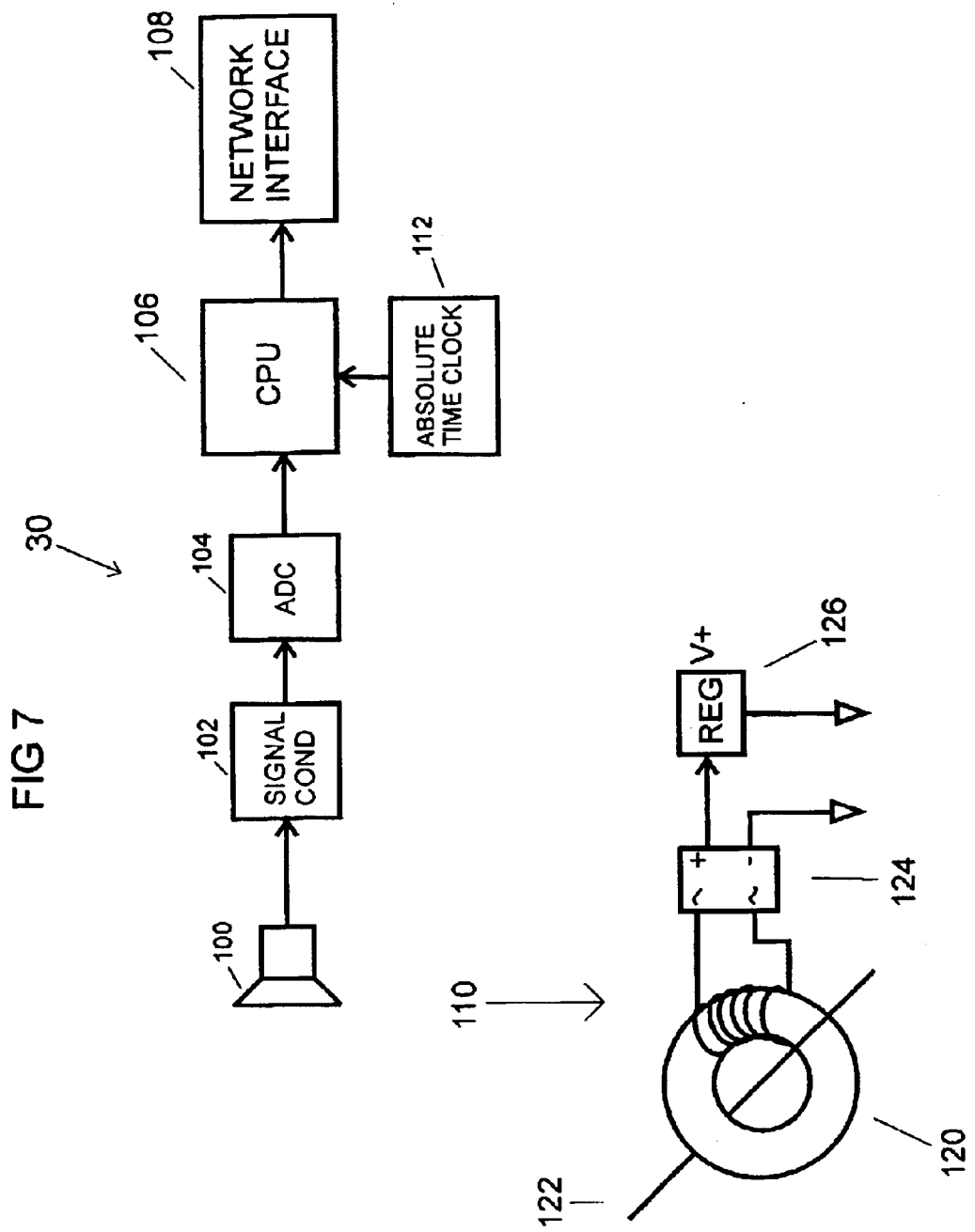
FIG. 7 provides a block diagram of the sensor for use in the inventive system of FIG. 5 wherein electrical power to operate the sensor is inductively coupled from a power line.

Turning to FIG. 7, yet another solution is that used in sensor 30. Power supply 110 employs a current sensing coil 120 of the type typically used to measure electrical current in AC circuits. Such coils produce a voltage proportional to the electrical current flowing through a wire 122 passing through the sense coil 120. The output of the coil is then rectified by bridge 124 and regulated to a relatively constant voltage (V+) by regulator 126. Optionally, sensor 30 can include a battery which is recharged during periods where current is flowing through wire 122 and which provides operational power for sensor 30 when insufficient or no current is flowing through wire 122. Since power lines are strung overhead, when not buried, the lines provide both a good vantage point for listening and a source of electrical power which can be inductively coupled into sensor 30 with no physical electrical connection to the power line. Accordingly, the voltage present on power line 122 is immaterial.

A significant advantage of the present invention over most prior art systems is its ability to network. Systems which perform analysis of the acoustic information at a host processor, or measure relative times of arrival at the host, require a dedicated communication channel for each sensor. The present invention provides the advantage that, since absolute time of arrival is measured at the sensor, latency in reporting the time to the host is immaterial to the accuracy of the calculation of the position. Accordingly, large numbers of sensors can share a single communication channel making sensors 22 well suited for networking. In fact, network interface 108 can be of a type to access virtually any known networking scheme, i.e.: ethernet; token ring; the internet through dial-up, cellular connection, dsl, cable TV, T1, etc.; IEEE-1394 schemes; USB schemes; wireless schemes; and the like. As will be apparent to those skilled in the art, wireless networking is particularly well suited to the present invention since wireless communication between sensors 22 and host 26 substantially reduces the time of deployment and costs associated with developing support infrastructure.

Figure 8:
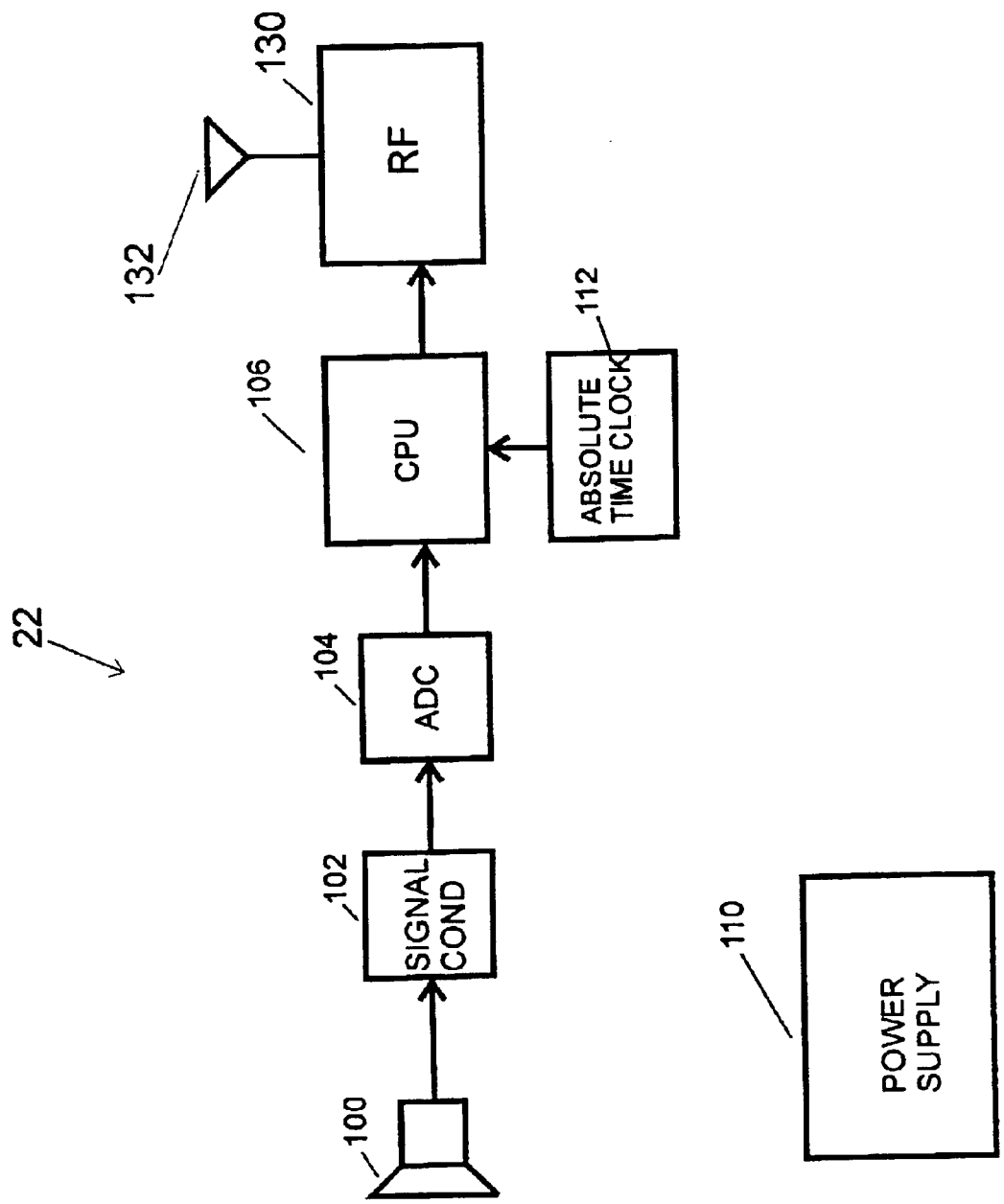
FIG. 8 provides a block diagram of the sensor of FIG. 5 wherein the communication interface is wireless.

Referring to FIG. 8, a sensor 22 is shown having a radio frequency network interface 130 which communicates with external systems in a wireless fashion through antenna 132. A number of wireless network solutions are available such as wireless interfaces conforming to IEEE-802.11 b or 900 MHz spread spectrum systems which are known to have a reliable range of three, or more, miles. With further reference to FIG. 9, each sensor 22 in system 20 communicates wirelessly over network 24 with host 26 which also include a wireless network interface (not shown).

Figure 10:
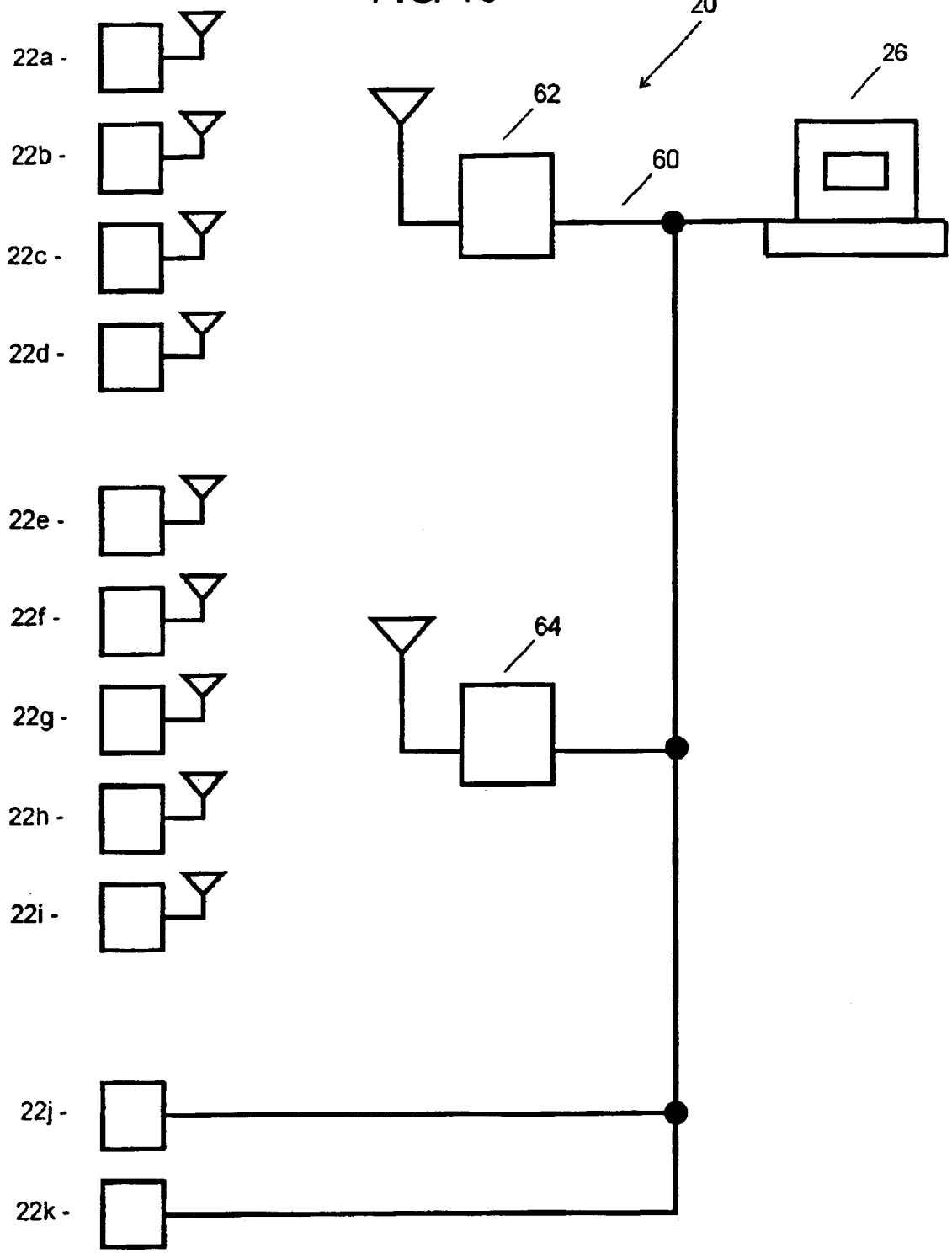
FIG. 10 provides a block diagram of the inventive system configured to monitor a large, diverse area.

As a practical matter, it is envisioned that in an urban environment there will often be many square miles of monitored area with between eight and twenty sensors per square mile, depending on terrain, buildings, and other obstructions. It is likely that in such a setting, various sensor configurations will be required to adapt to particular sites. Thus, as shown in FIG. 10, a typical system will include a plurality of sensors 22a–k. Where possible, sensors will be connected wirelessly to the network, i.e., sensors 22a–i, and where not practical, connected directly to a wired network 60, i.e., sensors 22j–k.

Where host 26 is located outside of the range of the network interfaces 130 (FIG. 8) of sensors 22a–d, a separate receiver 62 may be supplied to relay data back-and-forth between individual sensors 22a–d and host 26. Furthermore, if sensors are spread over an area larger than the range of receiver 62, additional receivers, i.e., receiver 64, may be necessary to likewise relay messages. Ideally, receivers 62 and 64 connect to network 60 for communication with host 26. As will be apparent to those skilled in the art, network 60 may be either the internet or a private network. Further, it should be noted that receivers 62 and 64 can also be used to communicate with other wireless devices such as PDAs, devices in patrol cars, etc.

Figure 11:
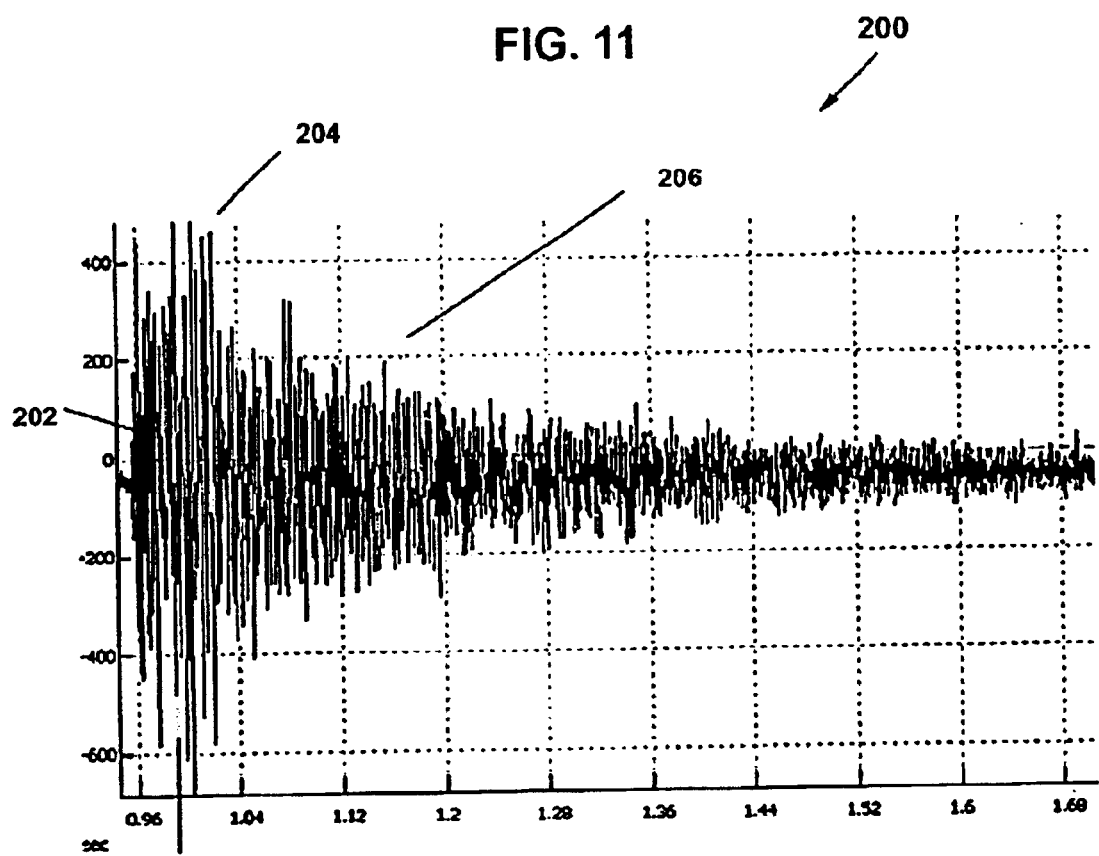
FIG. 11 depicts a typical waveform representative of a gunshot.

Turning then to FIG. 11 wherein is shown a typical gunshot 200, taken from a recording of a 0.357 magnum revolver fired indoors. Analyzing gunshot 200 it can be seen that the sound exhibits a sharp attack at 202 and maintains a somewhat sustained level at 204 before terminating in an exponential decay at 206. The spectral content of the noise inside the envelope is generally random, at least over a moderate range of frequencies. Empirically, it has been found that larger caliber weapons tend to exhibit a longer decay than their smaller caliber counterparts.

Figure 12:
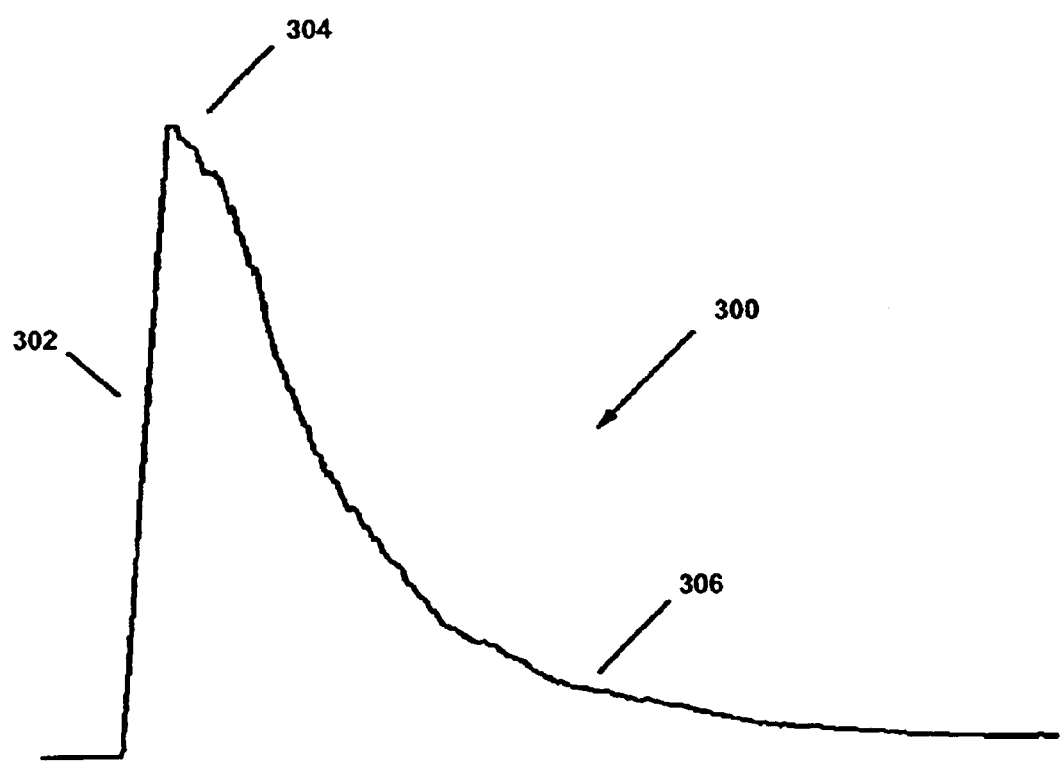
FIG. 12 depicts the envelope of the gunshot of FIG. 11.

With further reference to FIG. 12, an envelope 300 can be derived from gunshot 200 which generally defines the amplitude of the sound of gunshot 200 throughout its duration. Thus, the relative steep rising edge 302 of envelope 300 corresponds to attack 202 of gunshot 200. The sustained level 204 and decay 206 likewise correspond to portions 304 and 306 of envelope 300. Envelope 300 is generally typical of explosive type sounds.

Figure 13:
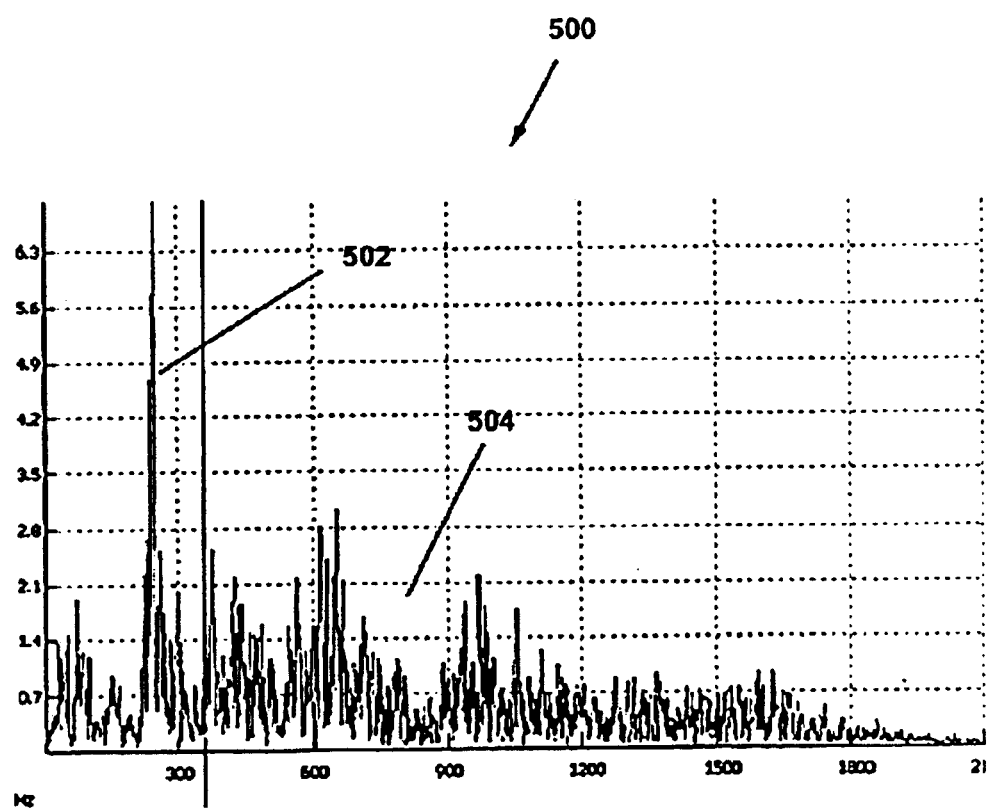
FIG. 13 depicts a frequency domain representation of the gunshot of FIG. 11.

With still further reference to FIG. 13, the spectral content of gunshot 200 can be found by performing a transformation from the time domain, as represented by graph 200 to the frequency domain, as represented by graph 500, typically through a Fourier transform. As can be seen in FIG. 13, the spectral content of gunshot 200 shows a noise floor 504 extending from the lower end of the audible spectrum and tapering off somewhere above 1 kilohertz. Of particular significance is the single predominant spike 502 at approximately 240 Hertz. Typically, significant periodic information would be indicative of a resonance, likely from the frame of the gun, the resonance of the barrel cavity, or other like feature of the gun. Accordingly, guns of different caliber or different class will exhibit strikingly different spectral content. Features which allow identification of a weapon include: the rise time of the sound as best indicated by portion 302; the duration of sustained noise as indicated by portion 304; the time of exponential decay as indicated by 306; the width and shape of the noise floor 504; and the characteristics of periodic energy 502.

Figure 14A:
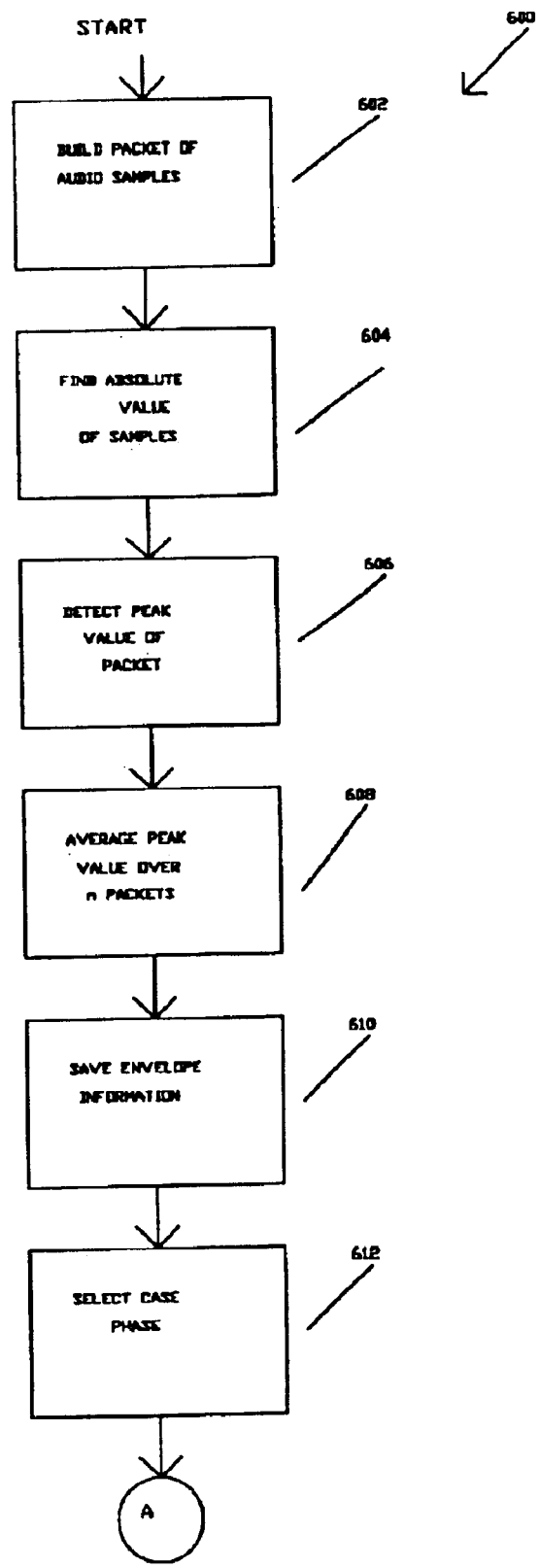
FIGS. 14A and 14B provide a flow chart for discriminating a particular acoustic event from other sounds received at a sensor.
Figure 14B:
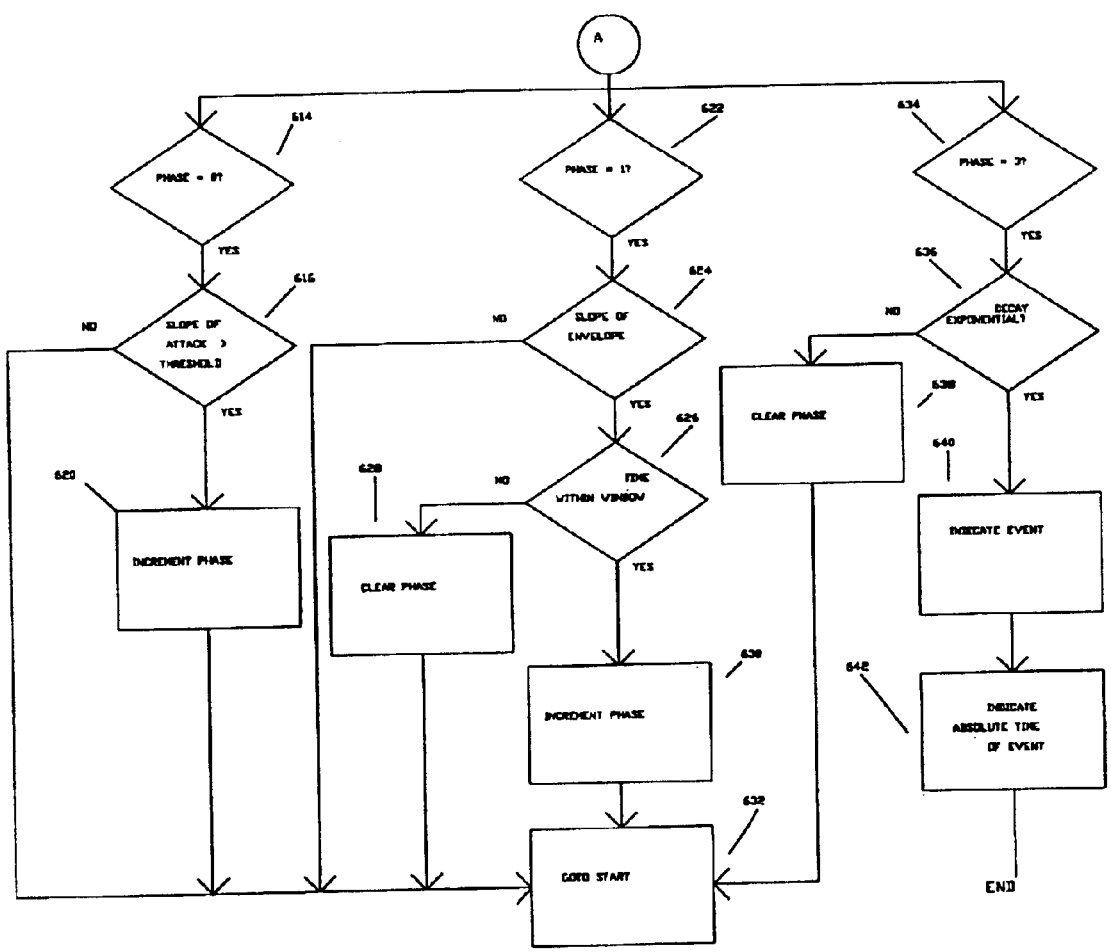

A preferred method 600 for discriminating explosive events from other sounds is shown in the flow chart of FIGS. 14A and 14B. Starting at step 600, a packet of audio samples is collected from A/D converter 104 (FIG. 5). In one preferred embodiment, converter 104 is sampled at approximately 8 kilohertz. Each packet is made up of thirty- two samples representing 4 milliseconds of information. When the packet is collected, the absolute value is taken of each sample at step 604, essentially performing full-wave bridge rectification of the input signal. Next, the peak value is detected at step 606 and averaged with a group of prior packets at 608. In the preferred embodiment, peak value is averaged with the thirty-one immediately prior peak values to find the next point in the envelope which is then saved at step 610.

It should be noted that envelope information can be gathered by a number of schemes and any technique which produces envelope information is suitable for practicing the method of the present invention. However, an advantage of the embodiment described above lies in the fact that 1024 samples of data are processed using only 64 bytes of ram (assuming converter 104 is an eight bit device). Thus the described embodiment is ideally suited for use where CPU 106 is a microcontroller having limited amounts of random access memory (hereinafter "RAM") available. Where spectral content is analyzed, larger amounts of RAM are required. In such embodiments, less memory efficient techniques may be employed to derive the envelope which provide some gain in accuracy or reduce processing time.

Continuing with flow chart 600, the variable "Phase" is used to determine the amount of detection that has occurred on a sound being received at step 612. "Phase" is initially zero and thus, the process follows step 614. At step 616, if the slope of the envelope is greater than zero, "Phase" is incremented at step 620 indicating that the attack portion of a waveform is in process. If, at step 616, the slope of the envelope is less than or equal to zero, the process returns to collect the next packet. On completion of collecting the next packet, steps 602–612 are performed as above. If "Phase" equals one, indicating that the attack portion is occurring, processing proceeds through step 622. At step 624 if the slope of the envelope is still greater than zero, processing returns to collect the next packet. If, at step 624 the slope is less than or equal to zero, the attack portion has ended and the time elapsed during the attack portion is measured. If the duration of the attack is of sufficient length at step 626, "Phase" is incremented to proceed to the next phase of detection. If the duration of the attack is too long at step 626, Phase is cleared so that processing of the received signal will start over. As will be apparent to those skilled in the art, the duration of the attack is significant rather than the slope or amplitude of the attack since the amplitude will decrease substantially with increasing distance of the gunshot from the sensor and, with decreasing amplitude, there is a corresponding decrease in slope. Thus, the duration of the attack is a key feature in recognizing a gunshot. If the duration is less than the threshold, "Phase" is incremented to move on to the next level of detection.

Once again after collecting the next packet and building the envelope value in steps 602–612, processing continues through step 634 since "Phase" is equal to three. At step 636, is the envelope follows an exponential decay, an event is indicated at step 640 and absolute time of the event is reported at step 642. As will be apparent to those skilled in the art, an exponential decay of the envelope will be generally defined by the value of the envelope at the time of the end of the sustain portion (i.e., portion 304 of FIG. 12) and a time constant. One method to determine the time constant is to measure the length of time which passes between the start of the decay (t0), and the time (t1) to reach a predetermined percentage of the starting value, for example, 80%. An exponential decay is given by the equation:

$$V_1 = V_0 e^{-(t/tc)}$$

where: V1 is the voltage at time t; V0 is the initial voltage; t equals $t_1 - t_0$; and tc is the time constant. Solving for the time constant (tc) yields:

$$tc = 4.48 \, (t_1 - t_0)$$

If the envelope decays in an exponential manner, the time to reach any voltage can be predicted. Empirically it has been determined that testing two points displaced somewhat from $t_1$ (e.g., when the voltage is 60% and 40% of the starting value) provides a reasonably accurate determination of an exponential decay.

It should be noted that the time constant is independent of received amplitude and further, that the time constant provides a rough estimation of the size of the weapon. In a minimal system, merely determining the time constant and qualifying the envelope in the manner discussed above allows accurate discrimination between gunshots and most other explosive events such as firecrackers.

More preferably however, CPU 106 is provided with sufficient RAM to store an entire gunshot. After qualifying a sound through analysis of the envelope as discussed above, CPU 106 continues with spectral analysis to identify the type of gun used.

Figure 15:
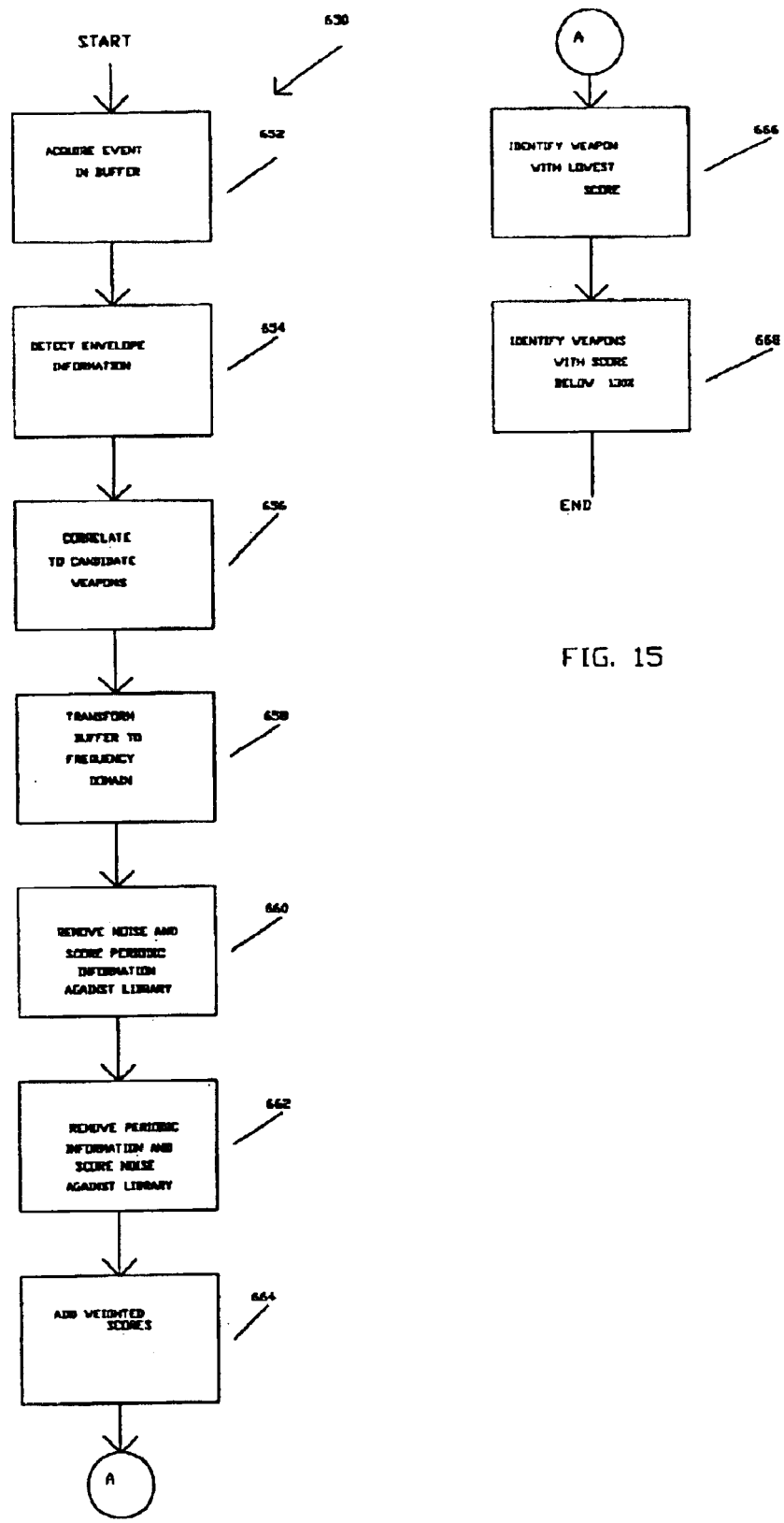
FIG. 15 provides a flow chart for a preferred method for distinguishing the type of weapon which produced a particular acoustic event.

Turning then to FIG. 15, flowchart 650 provides a method for analyzing and identifying the type of weapon by which a gunshot was produced. Starting at step 652, digitized acoustic data is constantly stored in a recirculating buffer. As the data is stored in the buffer, at step 654 envelope information is derived and processed according to the method of flowchart 600 of FIGS. 14A and 14B. Once a gunshot is detected, rise time, the sustain portion, and the time constant of the decay are compared to characteristic values stored in a table to produce a list of candidate weapons at step 656.

Next, at step 658, the buffer is transformed to the frequency domain using a Fourier transform. As will be apparent to those skilled in the art, there are a number of methods which may be employed to perform such a transform. The present inventive method is not sensitive to the type of transform used, only that a representation of the waveform in the frequency domain is produced. Further processing of the transformed data separates the periodic information at 660 and the noise information at 662, preferably, the noise floor is then subjected to filtering to produce a "smoothed" curve. The separate components of the spectral information are then scored against stored tables of known weapons. Scoring of both the periodic information and the noise floor occur in a similar manner. First, the event is normalized such that the largest value in the table is a predetermined value. Each table of known weapon types is previously stored in a like normalized manner. Point-by-point, a score is produced by summing the absolute value of the difference between the values stored for the event with those of a candidate weapon. The table of the event is then shifted left one location and the process is repeated. Next the table is shifted right one place from the original table and the process is repeated yet again. The score for a candidate weapon is then the lowest value of the three scores. At step 664, the scores are then weighted to favor the periodic score over the random score, and the weighted scores are added together for the candidate. After the process is repeated for all candidate weapons, at step 666, the weapon with the lowest score is identified as the most likely weapon used. At step 668 weapons which produce a score within a preset range, for example but not by way of limitation, 30%, are also reported. Preferably, along with the list of weapons, a sensor will also report the scores of the reported weapons to the host.

In addition to reporting weapon types, a sensor also reports the time of arrival of a gunshot. In the preferred embodiment, the time of arrival is measured at the peak of the attack. While the precise feature which is used as the reference for triggering time of arrival is somewhat arbitrary, the peak of the attack is highly recognizable.

It should be noted that some processing may also be required to obtain a time with the requisite accuracy. For example, many GPS receivers provide a time-mark which is typically a one pulse-per-second output synchronized to the beginning of a GPS second within a few nanoseconds. When such a receiver is used, the timing of fractional seconds must be performed within CPU 106 (FIG. 6), or an external device. Preferably, CPU 106 includes a timer with a capture register for capturing the count present at the timer upon the occurrence of an external event. Each rising edge of the time-mark signal causes the timer to store its count in a capture register and reset the counter. Upon the occurrence of a reportable event, CPU 106 retrieves the present value of the counter in CPU clock ticks. Next CPU 106 divides the value retrieved by the number of clock cycles recorded in the capture register for the previous second. The significance of this step is that the accuracy of the fractional second value resulting from the divide operation is enhanced well beyond the accuracy of the clock source, typically a crystal, to that of the GPS clock. The accuracy of a crystal is typically specified to be within 0.05%. In contrast, many suppliers hold that the time-mark output of a GPS receiver has an accuracy of one part in $10^9$.

Figure 16:
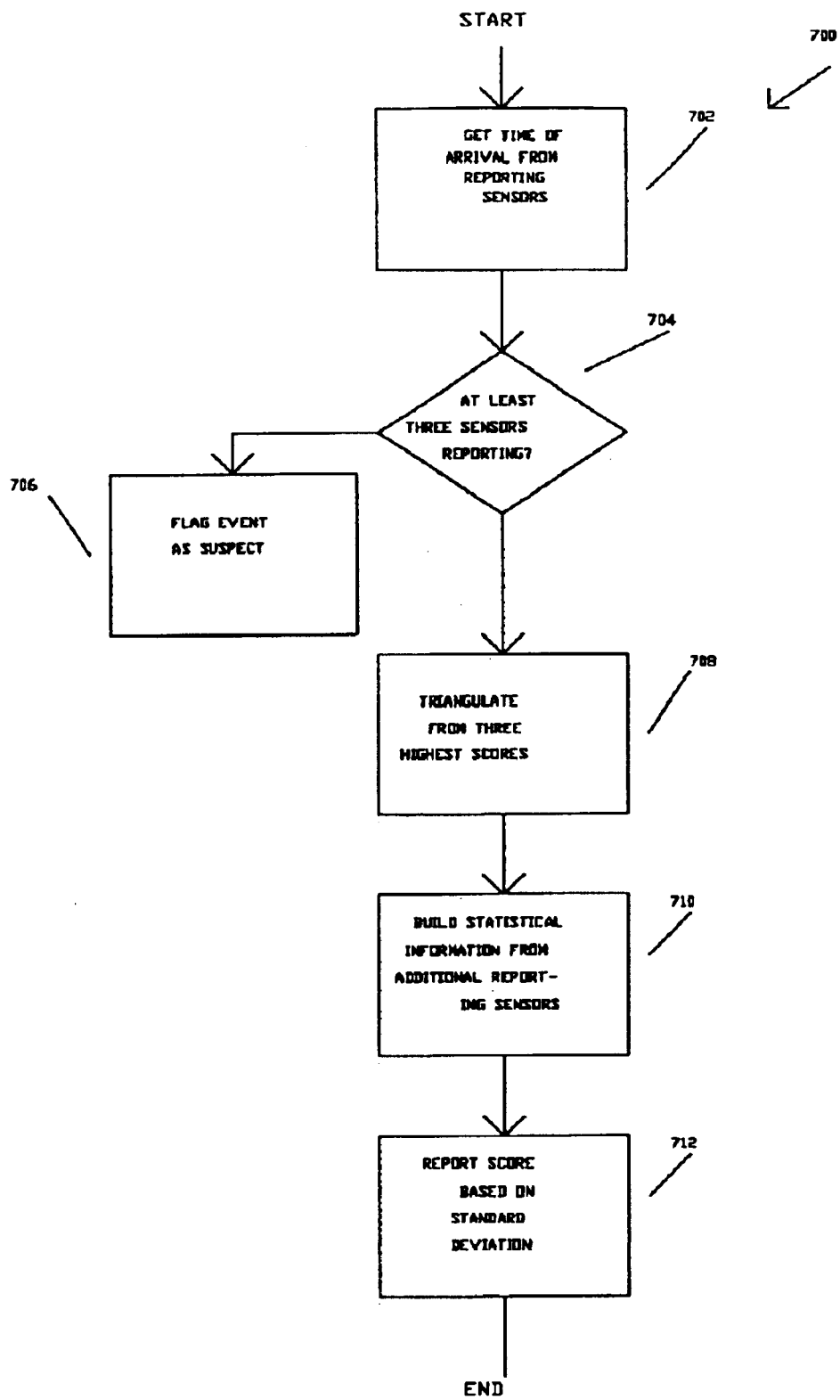
FIG. 16 provides a flow chart for locating the source of the gunshot as reported by a sensor according to the flow chart of FIG. 12.

Referring once again to FIG. 10, in a monitoring system 20 it is most preferable that the sensors be positioned such that at least three sensors will hear a gunshot event. When a gunshot occurs, each sensor 22a–k which receives the event performs the processing necessary to recognize the event, identify a most likely candidate weapon, and determine time of arrival. This information is then via network 60 to host 26. At the host time-of-arrival information is processed to triangulate on a particular target. This process is shown in flowchart 700 of FIG. 16.

At step 702, host 26 receives information from reporting sensors (e.g., sensors 22a–c, 22e, and 22k). At 704, host 26 checks to be sure three sensors have reported. It should be noted that no positional information can be derived from a single reporting sensor, except by assuming the event must be very close to that sensor, and if only two sensors report, the position of the gunshot can only be predicted to lie along a particular curve. Thus, if only one or two sensors report, the event is flagged as suspect at step 706. It should be noted that a rough position is still supplied by host 26, the position is simply flagged as being an approximation rather than a precise position fix.

If, as in this example, three or more sensors 22 report, host 26 selects the three sensors reporting the best correlation to a candidate weapon (e.g., sensors 22b, 22e, and 22k). Alternatively, host 26 could select the three reporting sensors in closest proximity to each other, or some other quality standard. Using the locations of the three selected sensors and the times-of-arrival at the sensors, the host calculates a location for the source of the gunshot through well known triangulation techniques as discussed in more detail hereinbelow. Next, at step 710 host 26 uses data from the remaining reporting sensors (in this example sensors 22a and 22c) to determine the potential error in the calculated position. Using the information associated with the calculated position, host 26 tests the information from sensors 22a and 22b. If this information results in a position different from that of the original calculation, host 26 calculates statistical information with regard to the error between the reporting sensors at step 710. Finally, at step 712, host 26 reports the position and scores the result based on the standard deviation calculated from the additional reporting sensors.

As mentioned above, triangulation is well known in the art and, in fact, is performed within the GPS receiver to calculate a position on earth relative to a plurality of satellites in space. With regard to using times-of-arrival and sensor locations to determine the position the source of an event, it should first be noted that, at the time of reporting, the precise time of the event ($t_0$) is unknown. Assuming an event is detected at three or more sensors, the precise location and precise time of the event are given by:

$d_1 = s(t_1 - t_0);$ $d_2 = s(t_2 - t_0);$ $d_3 = s(t_3 - t_0);$ $d_1 = ((x_1 - x_0)^2 + (y_1 - y_0)^2)^{0.5};$ $d_2 = ((x_2 - x_0)^2 + (y_2 - y_0)^2)^{0.5};$ and $d_3 = ((x_3 - x_0)^2 + (y_3 - y_0)^2)^{0.5};$ where: unknown terms: $x_0$, $y_0$ are the location of the source of the event; $t_0$ is the time of the event; and $d_n$ the distance from the event to sensor n. Known terms: s is the speed of sound; $x_n$, $y_n$ are the location of a sensor n; and $t_n$ is the time of arrival at sensor n.

Thus, calculating the location and precise time of an event requires the solving of six equations in six unknowns.

As is well known in the art, the speed of sound (s) varies somewhat with temperature, relative humidity, and air pressure. Ideally, host 26 will either have sensors for measuring outdoor temperature, relative humidity, and barometric pressure, or have access to such information. Host 26 can periodically calculate the speed of sound based on local environmental factors, so that at the time of an event, the speed of sound is, for all practical purposes, a constant.

As will be apparent to those skilled in the art, calculating a solution from the above equations may be somewhat cumbersome, particularly in light of the limited processing power which might be available at host 26. A number of methods can be used to simplify the process of locating the source of an event such as assuming an initial $t_0$ and adjusting $t_0$ on an iterative basis until the equations solve and then calculating progressively larger circles which conform to the received times from each sensor until a common point of intersection is found between the three circles. Regardless of the exact technique used, triangulation to an event based on times of arrivals is well known in the art and used in areas such as seismic exploration, earthquake detection, and even GPS receivers. Any such technique may be adapted for use with the present invention to obtain the requisite positional accuracy.

It should also be noted that, while not required for many environments, nonetheless, for greatest accuracy the altitude of the reporting sensors should be considered and the location of the shooter should be fixed in three dimensions. If calculations are limited to two dimensions, inaccuracies can arise with events located close to a sensor since the sensor may be some distance above the ground. If, for example, the technique of estimating an initial time and calculating expanding circles is used for a two dimensional fix, the technique can be extended to a three dimensional fix by iterative calculations of expanding spheres instead.

It should also be noted that, while preferred embodiments of the inventive system rely on GPS time to synchronize the clocks at every sensor, the invention is not so limited. GPS time is presently available and equipment exists to harness the transmitted information to synchronize clocks worldwide with sufficient accuracy to practice the present invention. However, the inventive system could employ any system for synchronizing clocks as long as the clocks are held in synchronization with sufficient tolerance to allow satisfactory triangulation to an event. The accuracy of the clocks affects the accuracy of the position calculation in that, the accuracy of a position fix is limited to the potential time difference between two clocks divided times the speed of sound.

It should also be noted that a common theme among the various methods of providing electrical power is the use of a battery to operate the system, either as primary power, or to fill-in during periods of power outage. Either way, when powered from a battery it is preferable to take steps to reduce power usage of the sensor to increase battery life. Many GPS receivers provide a sleep mode wherein the power requirements are a mere fraction of the power requirements of the operational mode. Unfortunately, time keeping functions stop in the sleep mode.

As discussed above, unlike prior art systems, latency in the delivery of the information related to an event does not affect the accuracy of the location calculation of the present invention. As a result, a sensor operating from a battery can put its GPS to sleep until an event is detected. Upon detection of the event, the sensor will direct the GPS to wake-up and use the internal CPU clock to measure time until the GPS is fully functional and time keeping function are restored, typically a few seconds. Once the GPS is fully functional, the accuracy of the time recorded from the CPU clock can be enhanced using the time mark function of the GPS as discussed in detail hereinabove. While the degree of improvement in battery life will vary with the type of GPS receiver selected and the number of triggering events which occur, on the average it is believed that battery life can be extended by roughly a factor of four. In installations where a delay of eight to ten seconds in providing the location of the source is acceptable, it is preferable to use this scheme when the unit is operating from battery power.

It should also be noted that, while the preferred embodiments have been described with respect to a gunshot detector, the invention is not so limited. The invention can be adapted to detect virtually any acoustic event where the waves propagate through virtually any medium. Any such adaptations are within the scope and spirit of the present invention. For example, the invention could be readily adapted to detect glass breaking, screams, car crashes, etc. which propagate through air. Likewise, the invention could be readily adapted to detect and locate footsteps, earthquakes, etc. through seismic transducers; or sonar pings, or the like, through hydraulic sensors.

It should also be noted that, where acoustic waves are constrained to a linear, or fixed, path, positional fixes can be obtained from two sensors. Such embodiments could look for events through railroad tracks such as the cutting of a track, or detect a person climbing a fence, as at a fenced boarder, or at a prison fence, etc.

In military applications, the present invention is particularly well suited for sighting weapons such as mortars and artillery. In such an application, the system could initially detect the position of an aggressor as discussed above. Then, upon issuing return fire, the system can detect the point of impact of the return fire and adjust the azimuth and elevation to zero in on the target with a second shot. This method will correct for errors in targeting caused by wind or any other variable in sighting. In both military and civilian applications, the present invention can be used to automatically direct security cameras, lighting, etc. to point to the source of a detected sound such as a scream or breaking glass.

It should be further noted that, consistent with the objects of the invention, a system for detecting gunshots according to the present invention can be deployed within a few hours. Deploying sensors 30 which parasitically take power from power lines, or sensors 22 which are solar powered, both equipped with wireless interfaces, individual sensors can begin reporting within seconds of installation. With a GPS in each sensor 22 or 30, the system can self-survey as sensors are deployed. Receivers (i.e., receivers 62 and 64) can be deployed at locations where internet access pre-exists, or gain internet access immediately through a cellular telephone network. Each receiver can then report to an existing application server which monitors multiple jurisdictions. Upon the detection of a gunshot, the application server can immediately notify the appropriate authorities with the pertinent information about the event. In fact, on a battlefield, deployment of battery operated sensors could be as simple as dropping sensors from an airplane onto the battlefield ahead of advancing troops.

Finally, it should also be noted that the terms employed in the discussion of the preferred embodiments are to be given their broadest meaning. By way of example, but not by way of limitation, the term "microprocessor" used broadly to describe programmable devices, including but not limited to microcontrollers, risk processors, ARM processors, digital signal processors, logic arrays, and the like. Similarly, for purposes of this invention, the term "GPS" should be broadly construed to include any satellite based navigation system, regardless of the country of origin.

Thus, the present invention is well adapted to carry out the objects and attain the ends and advantages mentioned above as well as those inherent therein. While presently preferred embodiments have been described for purposes of this disclosure, numerous changes and modifications will be apparent to those skilled in the art. Such changes and modifications are encompassed within the spirit of this invention.

What is claimed is:

1. A sensor for detecting and providing a time of arrival of an acoustic event produced in the environment comprising:
   a microphone acoustically coupled to the environment, such that said microphone provides a signal representative of acoustic waves received at said sensor;
   a microprocessor, said microprocessor being in electrical communication with said microphone such that a digital representation of said signal is present in said microprocessor;
   an absolute time clock in digital communication with said microprocessor such that said microprocessor can obtain synchronized time from said absolute time clock;
   a network interface in digital communication with said microprocessor such that said microprocessor can communicate over a computer network,
   wherein when a predetermined event is received at said microphone, said microprocessor obtains a time of arrival from said absolute time clock and transmits said time of arrival over said communication network.

2. The sensor of claim 1 wherein said absolute time clock comprises a GPS receiver.

3. The sensor of claim 2 wherein said GPS receiver also communicates a position of said sensor to said microprocessor.

4. The sensor of claim 1 further comprising a power supply for supplying electrical power to said sensor.

5. The sensor of claim 4 wherein said power supply comprises a solar cell and a battery.

6. The sensor of claim 4 wherein said power supply comprises:
   a current sensing coil having an aperture for receiving a power line therethrough;
   a rectifier in communication with said current sensing coil, said rectifier providing a DC output;
   a voltage regulator having an input for receiving said DC output and a regulated output,
   wherein, when a power line is received through said aperture, electrical current flowing through the power line will induce a voltage in said current sensing coil which is rectified by said rectifier to produce said DC output.

7. The sensor of claim 1 wherein said network interface comprises a radio frequency transceiver.

8. The sensor of claim 1 wherein said network interface is configured to connect to an ethernet network.

9. The sensor of claim 1 wherein said network interface is configured to communicate over a cellular telephone network.

10. A system for locating and identifying an acoustic event comprising:
- a plurality of sensors for reporting a time of arrival of a known acoustic event, each of said sensors comprising:
  - a microphone, said microphone producing a signal indicative of acoustic waves received at the sensor;
  - a microprocessor in communication with said microphone such that information produced by said signal in response to said acoustic waves can be processed by said microprocessor to detect said known acoustic event;
  - an absolute time clock in digital communication with said microprocessor such that said microprocessor can obtain synchronized time from said absolute time clock; and
  - a network interface in digital communication with said microprocessor such that said microprocessor can communicate over a network;
- a network, each network interface of said plurality of sensors being connected to said network; and
- a host processor connected to said network,
- wherein, upon the occurrence of said known acoustic event, at least one sensor will detect said known acoustic event and, in response to said known acoustic event, report the identity of said acoustic event and the time of arrival of said known acoustic event to said host processor over said network.

11. The system for locating and identifying an acoustic event of claim 10 wherein said plurality of sensors includes at least three sensors and said known acoustic event is received by said at least three sensors and, upon receiving said time of arrival from said at least three sensors, said host processor will calculate a location for the source of said known acoustic event.

12. The system for locating and identifying an acoustic event of claim 11 wherein said host processor calculates a location and an initial time of said event by solving six equations in six unknown variables.

13. A method for locating the source of an acoustic event comprising the steps of:
- providing at least three sensors dispersed over an area to be monitored at known locations, each sensor having a microphone for receiving an acoustic event and a synchronized clock;
- providing a network, each of said at least three sensors being configured for communication over said network;
- receiving a known acoustic event at said at least three sensors;
- at each of said sensors, transmitting a time of arrival of said known acoustic event over said network, said time of arrival being obtained from said synchronized clock;
- receiving said time of arrival from each sensor of said at least three sensors at a processor; and
- at said processor, triangulating the location of the source of said known acoustic event from said received times of arrival and said known locations.

14. A method for identifying the source of a known acoustic event comprising the steps of:
- storing envelope and spectral characteristics of a particular acoustic event;
- receiving acoustic waves at a sensor;
- storing said acoustic waves in memory;
- processing the received acoustic waves to derive an envelope of the acoustic waves;
- performing a first correlation between points along the derived envelope and points along the stored envelope of said particular acoustic event;
- if said first correlation indicates that said derived envelope correlates with the stored envelope of said particular acoustic event, transforming the stored acoustic wave into the frequency domain to create spectral information of said received acoustic wave;
- performing a second correlation between said spectral information of said stored acoustic wave and said spectral characteristics of said particular acoustic event; and
- if a predetermined number of points of said spectral information correlate with points of said spectral characteristics, providing an identification that said acoustic waves were produced by an event matching said particular acoustic event.

* * * * *